US012021500B2

(12) United States Patent
Daimon (10) Patent No.: US 12,021,500 B2
(45) Date of Patent: Jun. 25, 2024

(54) ACOUSTIC WAVE DEVICE (71) Applicant: Murata Manufacturing Co., Ltd., Nagaokakyo (JP)

(72) Inventor: Katsuya Daimon, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 627 days.

(21) Appl. No.: 17/318,120

(22) Filed: May 12, 2021

(65) Prior Publication Data

US 2021/0265972 A1 Aug. 26, 2021

Related U.S. Application Data (63) Continuation of application No. PCT/JP2019/043906, filed on Nov. 8, 2019.

(30) Foreign Application Priority Data

Nov. 16, 2018 (JP) .................. 2018-215573

(51) Int. Cl.
H03H 9/02 (2006.01)
H03H 9/145 (2006.01)
H03H 9/25 (2006.01)

(52) U.S. Cl.
CPC .... *H03H 9/14558* (2013.01); *H03H 9/02637* (2013.01); *H03H 9/02866* (2013.01); *H03H 9/02992* (2013.01); *H03H 9/25* (2013.01)

(58) Field of Classification Search
CPC ........... H03H 9/14558; H03H 9/02637; H03H 9/02866; H03H 9/02992

(Continued)

(56) References Cited

U.S. PATENT DOCUMENTS

2009/0295507 A1 12/2009 Kando et al.
2011/0215883 A1* 9/2011 Fujiwara .................. H03H 9/64
333/195

(Continued)

FOREIGN PATENT DOCUMENTS

JP 2009-290472 A 12/2009
JP 2015-109574 A 6/2015

(Continued)

OTHER PUBLICATIONS

Official Communication issued in International Patent Application No. PCT/JP2019/043906, mailed on Dec. 24, 2019.
Office Action in JP2020555635, mailed May 31, 2022, 4 pages.

*Primary Examiner* — Derek J Rosenau
(74) *Attorney, Agent, or Firm* — Keating & Bennett, LLP (57) ABSTRACT An acoustic wave device includes a piezoelectric substrate, and an IDT electrode on the piezoelectric substrate. The piezoelectric substrate includes a high acoustic velocity layer, and a piezoelectric layer. The IDT electrode includes a first busbar and a second busbar, and first and second electrode fingers interdigitated with each other. A first envelope and a second envelope each extend in a slanted direction with respect to an acoustic wave propagation direction, the first envelope being an imaginary line formed by connecting tips of the first electrode fingers, the second envelope being an imaginary line formed by connecting tips of the second electrode fingers. The first dielectric film is located in at least one gap of first and second gaps, the first gaps being located between the first electrode fingers and the second busbar, the second gaps being located between the second electrode fingers and the first busbar. The first dielectric film has a density greater than a density of silicon oxide.

16 Claims, 7 Drawing Sheets (58) Field of Classification Search
USPC ...... 310/313 R, 313 A, 313 B, 313 C, 313 D
See application file for complete search history.

(56) References Cited

U.S. PATENT DOCUMENTS

| | | |
|---|---|---|
| 2013/0207747 A1 | 8/2013 | Nishii et al. |
| 2014/0001919 A1 | 1/2014 | Komatsu et al. |
| 2015/0069882 A1* | 3/2015 | Umeda .............. H03H 9/02574 |
| | | 310/313 B |
| 2016/0126928 A1* | 5/2016 | Ruile ....................... H03H 9/25 |
| | | 310/313 B |
| 2018/0097508 A1 | 4/2018 | Iwamoto et al. |
| 2018/0102755 A1 | 4/2018 | Takamine |
| 2019/0123721 A1 | 4/2019 | Takamine |

FOREIGN PATENT DOCUMENTS

| | | |
|---|---|---|
| WO | 2008/126614 A1 | 10/2008 |
| WO | 2011/142183 A1 | 11/2011 |
| WO | 2012/090873 A1 | 7/2012 |
| WO | 2012/127793 A1 | 9/2012 |
| WO | 2016/208236 A1 | 12/2016 |
| WO | 2016/208446 A1 | 12/2016 |
| WO | 2018003273 A1 | 1/2018 |
| WO | 2018/117060 A1 | 6/2018 |

* cited by examiner

ACOUSTIC WAVE DEVICE

CROSS REFERENCE TO RELATED APPLICATIONS

This application claims the benefit of priority to Japanese Patent Application No. 2018-215573 filed on Nov. 16, 2018 and is a Continuation Application of PCT Application No. PCT/JP2019/043906 filed on Nov. 8, 2019. The entire contents of each application are hereby incorporated herein by reference.

BACKGROUND OF THE INVENTION

1. Field of the Invention

The present invention relates to an acoustic wave device.

2. Description of the Related Art

In the related art, acoustic wave devices are used for a wide variety of applications including filters of cellular phones. International Publication No. 2016/208236 described below discloses an example of an acoustic wave device. The acoustic wave device includes a multilayer body, and an interdigital transducer (IDT) electrode. The multilayer body includes a high acoustic velocity support substrate, and a low acoustic velocity film and a piezoelectric film that are stacked in this order above the high acoustic velocity support substrate. The IDT electrode is disposed on the piezoelectric film. The acoustic wave device with the multilayer body can provide an increased Q-factor but is susceptible to transverse mode ripple.

International Publication No. 2016/208236 employs a slanted IDT electrode to reduce transverse mode ripple. A slanted IDT electrode refers to an IDT electrode designed such that an envelope being an imaginary line formed by connecting the tips of a plurality of electrode fingers connected to one busbar, and an envelope being an imaginary line formed by connecting the tips of a plurality of electrode fingers connected to the other busbar each extend in a slanted direction with respect to the direction of acoustic wave propagation.

SUMMARY OF THE INVENTION

However, when used in combination with the above-mentioned multilayer body, such a slanted IDT electrode design may still be susceptible to ripple near the resonant frequency in some cases.

Preferred embodiments of the present invention provide acoustic wave devices that each achieve reduced ripple near the resonant frequency.

An acoustic wave device according to a preferred embodiment of the present invention includes a piezoelectric substrate, and an interdigital transducer (IDT) electrode on the piezoelectric substrate. The piezoelectric substrate includes a high acoustic velocity layer, and a piezoelectric layer disposed directly or indirectly above the high acoustic velocity layer. The acoustic velocity of a bulk wave that propagates in the high acoustic velocity layer is greater than the acoustic velocity of an acoustic wave that propagates in the piezoelectric layer. The IDT electrode includes a first busbar and a second busbar that face each other, a plurality of first electrode fingers each connected at one end to the first busbar, and a plurality of second electrode fingers each connected at one end to the second busbar, the plurality of second electrode fingers being interdigitated with the plurality of first electrode fingers. A first envelope extends in a slanted direction with respect to a direction of acoustic wave propagation, the first envelope being an imaginary line formed by connecting tips of the plurality of first electrode fingers. A second envelope extends in a slanted direction with respect to the direction of acoustic wave propagation, the second envelope being an imaginary line formed by connecting tips of the plurality of second electrode fingers. A first dielectric film is located in at least one gap on the piezoelectric substrate, the at least one gap being at least one of a plurality of first gaps and a plurality of second gaps, the plurality of first gaps being located between the plurality of first electrode fingers and the second busbar, the plurality of second gaps being located between the plurality of second electrode fingers and the first busbar. The first dielectric film has a density greater than a density of silicon oxide.

Preferred embodiments of the present invention each make it possible to provide an acoustic wave device that achieves reduced ripple near the resonant frequency.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Specific preferred embodiments of the present invention are described below with reference to the drawings to facilitate understanding of the present invention.

It is to be noted that various preferred embodiments described herein are for illustrative purposes only, and components or features described with respect to different preferred embodiments may be partially substituted for or combined with one another.

Figure 1:
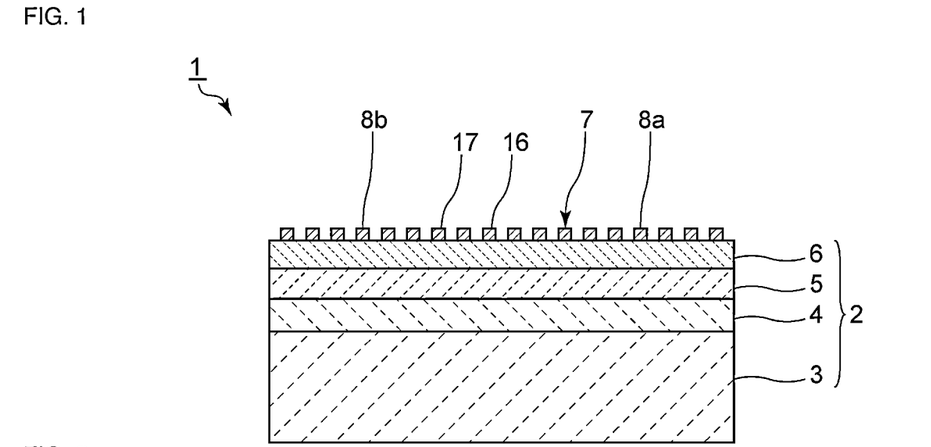
FIG. 1 is a front cross-sectional view of an acoustic wave device according to a first preferred embodiment of the present invention.

FIG. 1 is a front cross-sectional view of an acoustic wave device according to a first preferred embodiment of the present invention.

An acoustic wave device 1 includes a piezoelectric substrate 2. The piezoelectric substrate 2 includes a support substrate 3, a high acoustic velocity film 4 disposed on the support substrate 3, a low acoustic velocity film 5 disposed on the high acoustic velocity film 4, and a piezoelectric layer 6 disposed on the low acoustic velocity film 5. The piezoelectric layer 6 is a lithium tantalate film according to the first preferred embodiment. More specifically, the piezoelectric layer 6 is made of 50° YX-LiTaO$_3$. The cut angle of the piezoelectric layer 6 is not limited to the above-mentioned angle, nor is the material of the piezoelectric layer 6 limited to the above-mentioned material. For example, a piezoelectric single crystal such as lithium niobate, or a suitable piezoelectric ceramic material may be used as the main component of the piezoelectric layer 6.

An interdigital transducer (IDT) electrode 7 is disposed on the piezoelectric layer 6 of the piezoelectric substrate 2. Applying alternating-current voltage to the IDT electrode 7 causes an acoustic wave to be excited. A pair of reflectors, a reflector 8a and a reflector 8b, are disposed near opposite sides of the IDT electrode 7 on the piezoelectric layer 6 in the direction of acoustic wave propagation. As described above, the acoustic wave device 1 according to the first preferred is embodiment an acoustic wave resonator. Alternatively, however, an acoustic wave device according to a preferred embodiment of the present invention may be a filter device such as a ladder filter including an acoustic wave resonator.

The low acoustic velocity film 5 is a film with a relatively low acoustic velocity. More specifically, the acoustic velocity of a bulk wave that propagates in the low acoustic velocity film 5 is lower than the acoustic velocity of a bulk wave that propagates in the piezoelectric layer 6. The low acoustic velocity film 5 contains, as its main component, silicon oxide represented by SiO$_x$. The value of x is positive. According to the first preferred embodiment, the low acoustic velocity film 5 is a SiO$_2$ film. The low acoustic velocity film 5 may not necessarily be made of the above-mentioned material. Alternatively, the low acoustic velocity film 5 may be made of, for example, silicon oxide, glass, silicon oxynitride, tantalum oxide, or a material containing, as its main component, a compound with fluorine, carbon, or boron added to silicon oxide.

The high acoustic velocity film 4 defines and functions a high acoustic velocity layer of the acoustic wave device 1 according to a preferred embodiment of the present invention. The high acoustic velocity layer refers to a layer with a relatively high acoustic velocity. More specifically, the acoustic velocity of a bulk wave that propagates in the high acoustic velocity layer is higher than the acoustic velocity of an acoustic wave that propagates in the piezoelectric layer 6. According to the first preferred embodiment, the high acoustic velocity film 4, which defines and functions a high acoustic velocity layer, is a silicon nitride film. The high acoustic velocity film 4 may not necessarily be made of the above-mentioned material. Other examples of suitable materials may include: a piezoelectric material such as lithium tantalate, lithium niobate, or quartz; various ceramic materials such as alumina, zirconia, cordierite, mullite, steatite, or forsterite; aluminum nitride; aluminum oxide; silicon carbide; silicon nitride; silicon oxynitride; a diamond-like carbon (DLC) film; silicone; sapphire; diamond; magnesia; a material containing any of the above-mentioned materials as its main component; and a material containing a mixture of any of the above-mentioned materials as its main component.

According to the first preferred embodiment, the support substrate 3 is a silicon substrate. More specifically, the crystal orientation of the support substrate 3 is Si (100). The Euler angles (ϕ, θ, Ψ) of the support substrate 3 are (0°, 0°, 45°). The crystal orientation and Euler angles (ϕ, θ, Ψ) of the support substrate 3 are not limited to those mentioned above, nor is the material of the support substrate 3 limited to that mentioned above. Other examples of suitable materials may include: a piezoelectric material such as lithium tantalate, lithium niobate, or quartz; various ceramic materials such as alumina, magnesia, silicon nitride, aluminum nitride, silicon carbide, zirconia, cordierite, mullite, steatite, or forsterite; glass; spinel; aluminum nitride; aluminum oxide; silicon carbide; silicon nitride; silicon oxynitride; a DLC film; silicone; sapphire; diamond; magnesia; a material containing any of the above-mentioned materials as its main component; and a material containing a mixture of any of the above-mentioned materials as its main component.

According to the first preferred embodiment, the acoustic wave device 1 includes the piezoelectric substrate 2, which includes a multilayer body formed by stacking the high acoustic velocity film 4, the low acoustic velocity film 5, and the piezoelectric layer 6 in this order. This configuration effectively allows acoustic wave energy to be confined near the piezoelectric layer 6.

Figure 2:
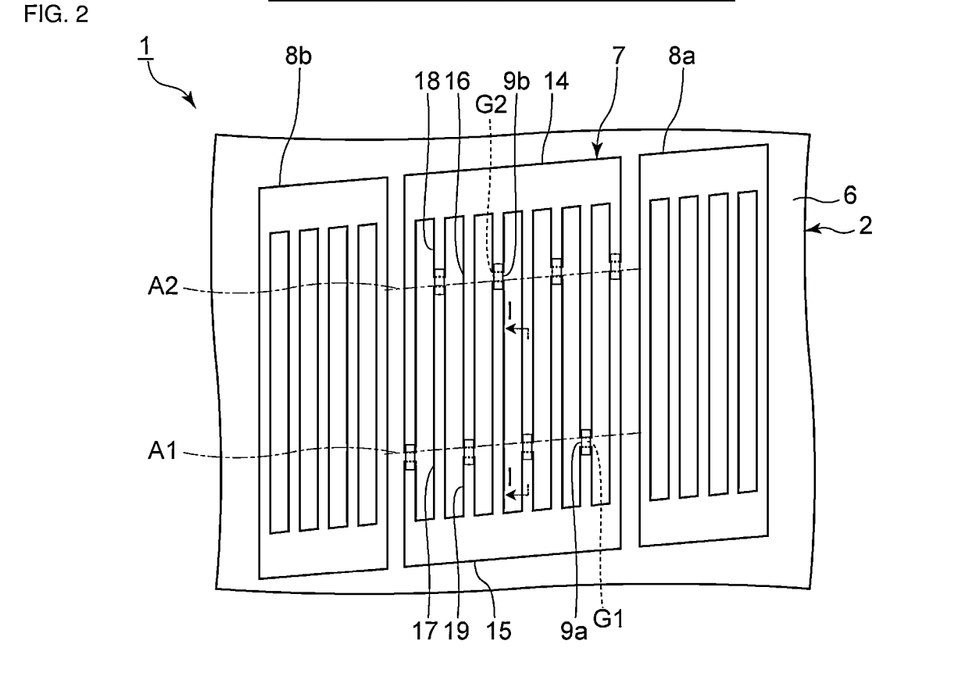
FIG. 2 is a plan view of an acoustic wave device according to the first preferred embodiment of the present invention.

FIG. 2 is a plan view of the acoustic wave device according to the first preferred embodiment.

The IDT electrode 7 includes a first busbar 14 and a second busbar 15 that face each other. The IDT electrode 7 includes a plurality of first electrode fingers 16 connected at one end thereof to the first busbar 14, and a plurality of second electrode fingers 17 connected at one end thereof to the second busbar 15. The first electrode fingers 16 and the second electrode fingers 17 are interdigitated with each other.

Further, the IDT electrode 7 includes a plurality of first dummy electrode fingers 18 connected at one end thereof to the first busbar 14. The first dummy electrode fingers 18 each face the corresponding one of the second electrode fingers 17 with a second gap G2 interposed therebetween.

The IDT electrode 7 includes a plurality of second dummy electrode fingers 19 connected at one end thereof to the second busbar 15.

The second dummy electrode fingers 19 each face the corresponding one of the first electrode fingers 16 with a first gap G1 interposed therebetween.

A first envelope A1, which is an imaginary line formed by connecting the tips of the first electrode fingers 16, extends in a slanted direction with respect to the direction of acoustic wave propagation. Likewise, a second envelope A2, which is an imaginary line formed by connecting the tips of the second electrode fingers 17, extends in a slanted direction with respect to the direction of acoustic wave propagation. The IDT electrode 7 is thus a slanted IDT electrode. Although there is no particular limitation on the slant angle by which the first envelope A1 and the second envelope A2 are slanted with respect to the direction of acoustic wave propagation, the slant angle preferably is about 7.5° according to the first preferred embodiment, for example.

According to the first preferred embodiment, a plurality of first gaps G1 are located between the corresponding first electrode fingers 16 and the corresponding second dummy electrode fingers 19. A plurality of second gaps G2 are located between the corresponding second electrode fingers 17 and the corresponding first dummy electrode fingers 18. It may suffice that the first gaps G1 be located between the corresponding first electrode fingers 16 and the second busbar 15, and that the second gaps G2 be located between the corresponding second electrode fingers 17 and the first busbar 14.

The IDT electrode 7 is made of a multilayer metal film with a Ti layer, an Al layer, and a Ti layer stacked in this order from the side near the piezoelectric substrate 2. According to the first preferred embodiment, each of the reflector 8a and the reflector 8b is also made of the same multilayer metal film as that of the IDT electrode 7. The material of the IDT electrode 7, the material of each of the reflectors 8a and 8b, the number of metal layers of the IDT electrode 7, and the number of metal layers of each of the reflectors 8a and 8b are not limited to those mentioned above. Alternatively, the IDT electrode 7, the reflector 8a, and the reflector 8b may be each made of a single-layer metal film.

Figure 3:
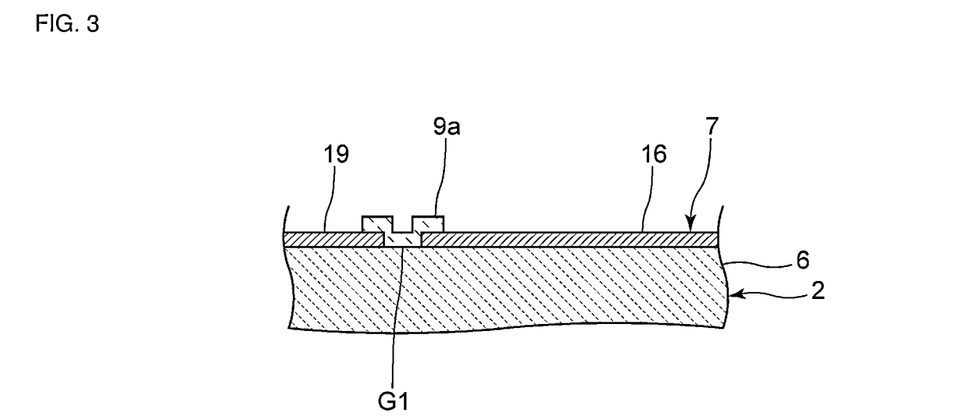
FIG. 3 is a cross-sectional view, taken along a line I-I in FIG. 2, of the vicinity of a first gap of an IDT electrode according to the first preferred embodiment of the present invention.

FIG. 3 is a cross-sectional view, taken along a line I-I in FIG. 2, of the vicinity of the first gap of the IDT electrode according to the first preferred embodiment.

A first dielectric film 9a is disposed in each of the first gaps G1 on the piezoelectric substrate 2. More specifically, a plurality of first dielectric films 9a are disposed such that each first dielectric film 9a extends across the entirety of the corresponding one of the first gaps G1.

Each of the first dielectric films 9a extends onto the first electrode finger 16 and onto the second dummy electrode finger 19. The first dielectric film 9a is disposed continuously at the following locations: at a location on the first electrode finger 16 near the tip of the first electrode finger 16; in the first gap G1; and at a location on the second dummy electrode finger 19 near the tip of the second dummy electrode finger 19. It may suffice that the first dielectric film 9a be disposed in at least a portion of the first gap G1.

Likewise, a plurality of first dielectric films 9b are disposed such that each first dielectric film 9b extends across the entirety of the corresponding one of the second gaps G2. Each of the first dielectric films 9b extends onto the second electrode finger 17 and onto the first dummy electrode finger 18. More specifically, the first dielectric film 9b is disposed continuously at the following locations: at a location on the second electrode finger 17 near the tip of the second electrode finger 17; in the second gap G2; and at a location on the first dummy electrode finger 18 near the tip of the first dummy electrode finger 18. It may suffice that the first dielectric film 9b be disposed in at least a portion of the second gap G2.

Figure 4:
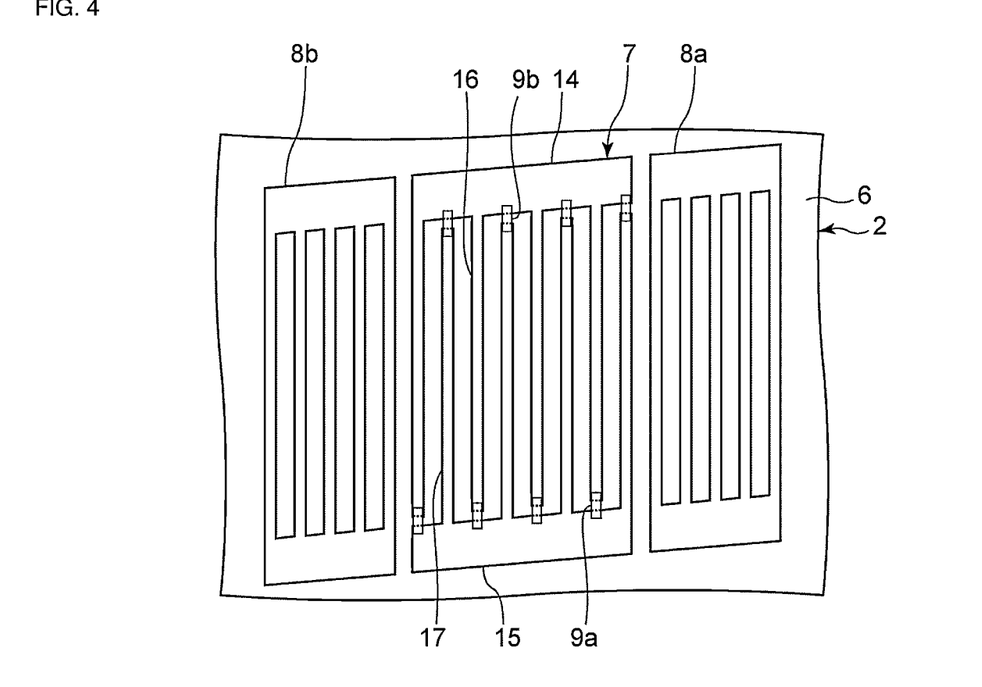
FIG. 4 is a plan view of the acoustic wave device according to the first preferred embodiment of the present invention, illustrating a modification of the IDT electrode.

The first dummy electrode finger 18 and the second dummy electrode finger 19 may not be provided. That is, as in the case of a modification of the IDT electrode 7 depicted in FIG. 4, the first dummy electrode finger 18 and the second dummy electrode finger 19 may not be provided. In this case, each of the first dielectric films 9a extends from a location on the first electrode finger 16 to a location on the second busbar 15 via the gap present between the first electrode finger 16 and the second busbar 15. Likewise, each first dielectric film 9b extends from a location on the second electrode finger 17 to a location on the first busbar 14 via the gap present between the second electrode finger 17 and the first busbar 14.

According to the first preferred embodiment, the first dielectric film 9a is provided in every first gap G1, and the first dielectric film 9b is provided in every second gap G2. The first dielectric film 9a may not necessarily be disposed in every first gap G1, and the first dielectric film 9b may not necessarily be disposed in every second gap G2. It may suffice that the first dielectric film 9a or the first dielectric film 9b be disposed in at least one of the first gaps G1 or in at least one of the second gaps G2.

According to the first preferred embodiment, the first dielectric film 9a and the first dielectric film 9b are tantalum pentoxide films. This, however, is not intended to be limiting. Alternatively, the first dielectric film 9a and the first dielectric film 9b may be any film with a density greater than the density of silicon oxide. The silicon oxide whose density herein defines and functions a reference for density comparison is $SiO_2$. The silicon oxide is herein assumed to have a density of approximately $2.21 \times 10^3$ [kg/m$^3$]. Other examples of suitable dielectrics to be included in the first dielectric film 9a and the first dielectric film 9b may include hafnium oxide, thorium oxide, and niobium nitride.

The first preferred embodiment has characteristic features described below. 1) The acoustic wave device includes the piezoelectric substrate 2, which includes a multilayer body with the high acoustic velocity film 4, the low acoustic velocity film 5, and the piezoelectric layer 6 stacked in this order, and the IDT electrode 7, which is a slanted IDT electrode disposed on the piezoelectric substrate 2. 2) The first dielectric films 9a and the first dielectric films 9b, which are dielectric films each having a density greater than the density of silicon oxide, are respectively provided in the corresponding first gaps G1 of the IDT electrode 7 and the corresponding second gaps G2 of the IDT electrode 7. These characteristic features help to reduce ripple near the resonant frequency. This is explained below through comparison of the first preferred embodiment with a comparative example.

Figure 5:
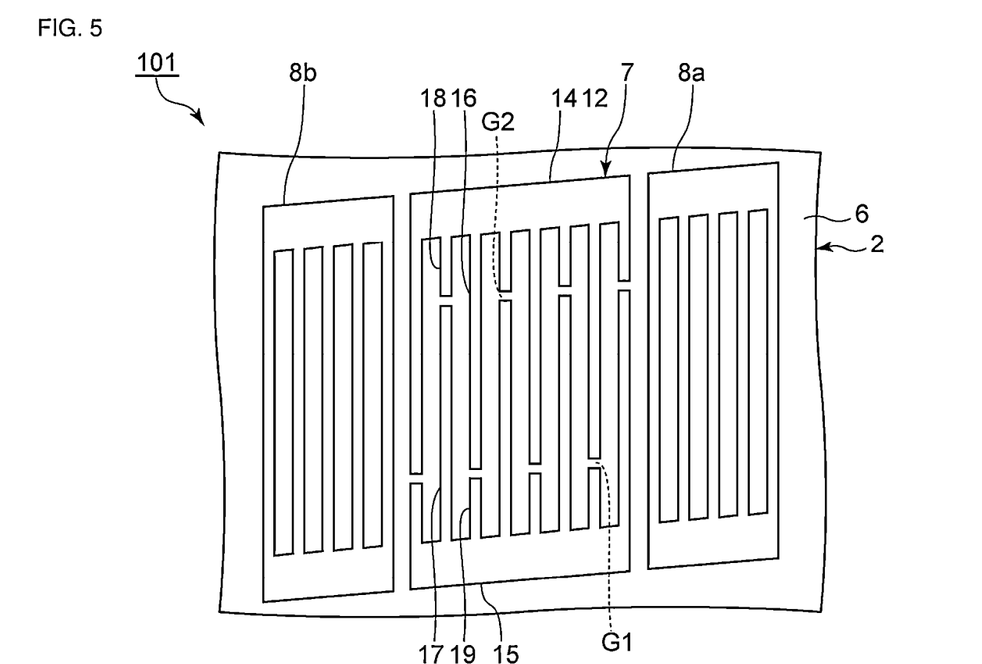
FIG. 5 is a plan view of an acoustic wave device according to a first comparative example.

As illustrated in FIG. 5, an acoustic wave device 101 according to a first comparative example is similar in configuration to the acoustic wave device 1 according to the first preferred embodiment, except that the acoustic wave device 101 does not have the first dielectric film 9a and the first dielectric film 9b described above with reference to the first preferred embodiment.

An acoustic wave device configured according to the first preferred embodiment, and an acoustic wave device according to the first comparative example are fabricated. The acoustic wave device configured according to the first preferred embodiment, and the acoustic wave device according to the first comparative example are fabricated under the conditions described below. The term wavelength as used in the following description refers to a wavelength determined by the pitch of the electrode fingers of the IDT electrode. With the IDT electrode viewed in the direction of acoustic wave propagation, a region where adjacent electrode fingers overlap each other is defined as overlap region of the IDT electrode, and the length of the overlap region in the direction in which the electrode fingers extend is defined as overlap width. The length of the first gap in the direction in which the electrode fingers extend is defined as first gap width, and the length of the second gap in the direction in which the electrode fingers extend is defined as second gap width.

- Piezoelectric layer: 50° YX-LiTaO$_3$ (material), 600 nm (film thickness)
- Low acoustic velocity film: silicon oxide (SiO$_2$) (material), 673 nm (film thickness)
- High acoustic velocity film: silicon nitride (SiN) (material), 900 nm (film thickness)
- Support substrate: silicon (Si) (material), Si (100) (crystal orientation), (0°, 0°, 45°) (Euler angles)
- Respective film thicknesses of the metal layers of the IDT electrode: 12 nm (film thickness of the Ti layer near the piezoelectric layer), 100 nm (film thickness of the Al layer), 4 nm (film thickness of the Ti layer)
- Wavelength: 2 μm
- Overlap width: 30 μm
- Number of electrode finger pairs of the IDT electrode: 100
- Slant angle: 7.5°
- First gap width and second gap width: 0.27 μm The first dielectric film of the acoustic wave device configured according to the first preferred embodiment is fabricated under the condition described below.

First dielectric film: tantalum pentoxide (Ta$_2$O$_5$) (material), 8.47×10$^3$ [kg/m$^3$] (density), 30 nm (film thickness)

Figure 6:
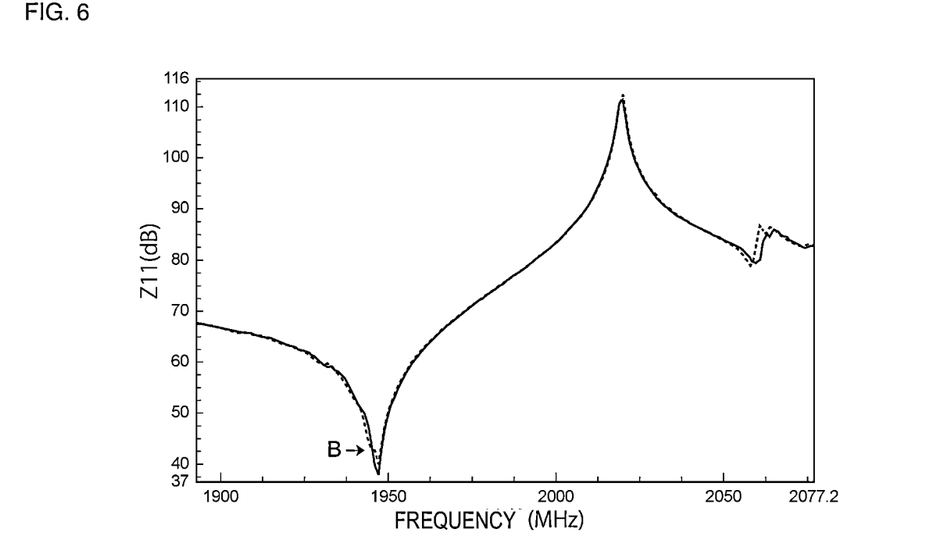
FIG. 6 illustrates impedance characteristics according to the first preferred embodiment of the present invention and according to a first comparative example.
Figure 7:
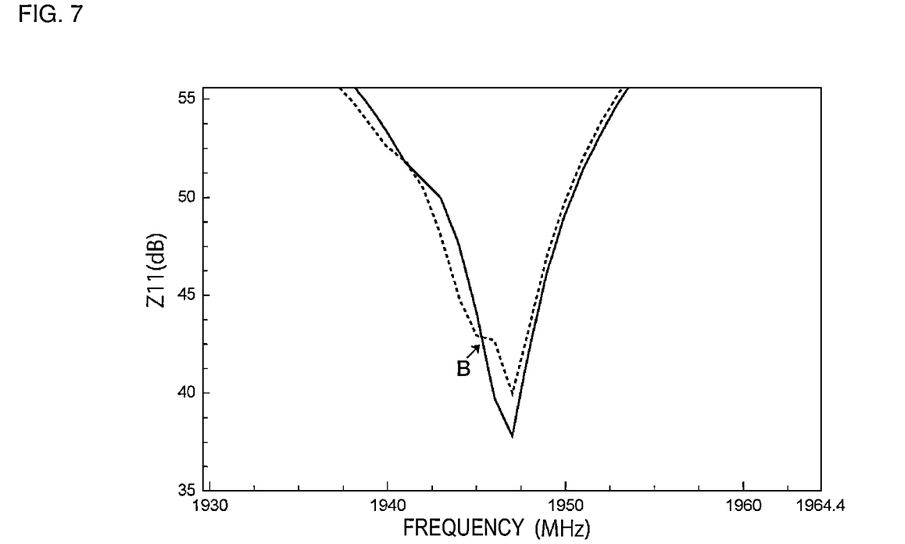
FIG. 7 illustrates impedance characteristics near the resonant frequency, according to the first preferred embodiment of the present invention and according to the first comparative example.

The respective impedance characteristics of the above-mentioned acoustic wave devices are illustrated in FIG. 6 and FIG. 7 described below.

FIG. 6 illustrates impedance characteristics according to the first preferred embodiment and according to the first comparative example. FIG. 7 illustrates impedance characteristics near the resonant frequency, according to the first preferred embodiment and according to the first comparative example. In FIGS. 6 and 7, the solid line represents the results according to the first preferred embodiment, and the broken line represents the results according to the first comparative example.

The first preferred embodiment and the first comparative example include a slanted IDT electrode, which leads to reduced ripple between the resonant frequency and the anti-resonant frequency as illustrated in FIG. 6. However, as indicated by an arrow B in FIGS. 6 and 7, it is appreciated that for the first comparative example, ripple occurs near the resonant frequency. By contrast, it is appreciated that for the first preferred embodiment, ripple does not occur near the resonant frequency. As described above, in addition to achieving reduced ripple between the resonant frequency and the anti-resonant frequency, the first preferred embodiment achieves reduced ripple near the resonant frequency.

The first comparative example uses the same piezoelectric substrate 2 as that according to the first preferred embodiment. Accordingly, in addition to an acoustic wave used as a main mode by the acoustic wave device, an unwanted wave that induces ripple is also likely to be confined near the piezoelectric layer. Further, the first electrode finger 16 and the second dummy electrode finger 19 are discontinuous with each other with the first gap G1 therebetween. Consequently, in the area where the IDT electrode 7 is present, the acoustic velocity has a discontinuity in the vicinity of the first gap G1. Likewise, in the area where the IDT electrode 7 is present, the acoustic velocity also has a discontinuity in the vicinity of the second gap G2. The ripple observed for the first comparative example is presumed to result from a mode confined near each of the first and second gaps G1 and G2 of the slanted IDT electrode 7.

By contrast, according to the first preferred embodiment, the first dielectric film 9a is disposed in the first gap G1 as illustrated in FIG. 2. Moreover, the first dielectric film 9a has a density greater than the density of silicon oxide. Consequently, the density of the first dielectric film 9a can be effectively made closer to the density of the IDT electrode 7, or can be made higher than the density of the IDT electrode 7. The state of mass addition in the first gap G1 can be thus effectively made closer to the state of mass addition in each of a location where the first electrode finger 16 is present and a location where the second dummy electrode finger 19 is present. As a result, the acoustic velocity in an area where the first gap G1 is disposed can be effectively made closer to the acoustic velocity in each of an area where the first electrode finger 16 is present and an area where the second dummy electrode finger 19 is present. This helps to reduce discontinuity between the first electrode finger 16 and the second dummy electrode finger 19 in the first gap G1.

Likewise, the presence of the first dielectric film 9b in the second gap G2 helps to reduce discontinuity between the second electrode finger 17 and the first dummy electrode finger 18 in the second gap G2. This helps to reduce mode confinement in the first gap G1 and the second gap G2. Therefore, ripple near the resonant frequency can be reduced.

Preferably, the first dielectric film 9a and the first dielectric film 9b each have a density greater than or equal to the density of the material of the IDT electrode 7. This ensures with increased reliability that the state of mass addition in the first gap G1 can be made closer to the state of mass addition in each of a location where the first electrode finger 16 is present and a location where the second dummy electrode finger 19 is present. In particular, if the first dielectric film 9a and the first dielectric film 9b are greater in density than the IDT electrode 7, this ensures that even if the first dielectric film 9a has a smaller film thickness than the IDT electrode 7, the state of mass addition in the first gap G1 can be effectively made closer to the state of mass addition in each of a location where the first electrode finger 16 is present and a location where the second dummy electrode finger 19 is present. Likewise, the above configuration ensures with increased reliability that the state of mass addition in the second gap G2 can be made closer to the state of mass addition in each of a location where the second electrode finger 17 is present and a location where the first dummy electrode finger 18 is present. Therefore, mode confinement in the first gap G1 and the second gap G2 can be reduced more effectively, and ripple near the resonant frequency can be thus reduced more effectively.

If the IDT electrode 7 is made of a multilayer metal film, then in this case the mean density of the multilayer metal film may be compared with the density of each of the first dielectric film 9a and the first dielectric film 9b. The mean density of the multilayer metal film may be calculated as follows. For each metal layer of the multilayer metal film, a film thickness proportion for the metal layer is calculated, the film thickness proportion being obtained by dividing the film thickness of the metal layer by the overall film thickness of the multilayer metal film. Then, for each metal layer, the product of thickness proportion and density is calculated. Then, the products for all the metal layers are summed up.

Preferably, the first dielectric film 9a and the first dielectric film 9b each have a density greater than or equal to the density of each of the first electrode finger 16 and the second electrode finger 17. This ensures that even if the metal layer of each of the first electrode finger 16 and the second electrode finger 17 is different from the metal layer of each of the first busbar 14 and the second busbar 15, the above-mentioned discontinuity in each of the first gap G1 and the second gap G2 can be reduced more reliably.

Preferably, the first dielectric film 9a extends across the entire first gap G1. This helps to further reduce the discontinuity between the first electrode finger 16 and the second dummy electrode finger 19. Likewise, the first dielectric film 9b is preferably disposed so as to extend across the entire second gap G2. This helps to further reduce the discontinuity between the second electrode finger 17 and the first dummy electrode finger 18. Therefore, ripple near the resonant frequency can be further reduced.

Further, more preferably, the first dielectric film 9a extends across the entire first gap G1, and extends onto the first electrode finger 16 and onto the second dummy electrode finger 19. Likewise, more preferably, the first dielectric film 9b extends across the entire second gap G2, and extends onto the second electrode finger 17 and onto the first dummy electrode finger 18. The above configuration ensures with increased reliability that, even if the first dielectric film 9a is displaced during manufacture of the acoustic wave device 1, the first dielectric film 9a can be positioned to extend across the entire first gap G1. Likewise, the above configuration ensures with increased reliability that the first dielectric film 9b can be positioned to extend across the entire second gap G2. This allows for more reliable and greater reduction of ripple near the resonant frequency.

Although the piezoelectric substrate 2 according to the first preferred embodiment is a multilayer body including the support substrate 3, the high acoustic velocity film 4, the low acoustic velocity film 5, and the piezoelectric layer 6 that are stacked in this order, this is not intended to be limiting. Reference is now made to first and second modifications of the first preferred embodiment, which are similar in configuration to the first preferred embodiment except for the piezoelectric substrate. As with the first preferred embodiment, the first and second modifications also allow for reduced ripple near the resonant frequency.

Figure 8:
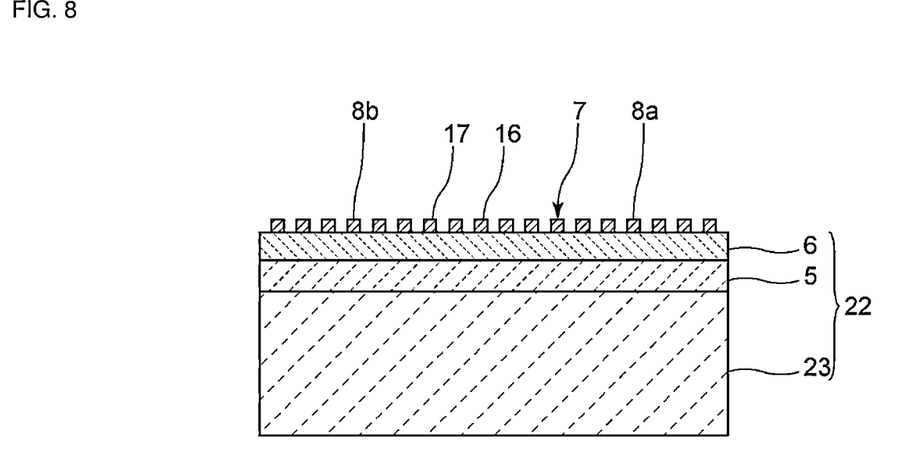
FIG. 8 is a front cross-sectional view of an acoustic wave device according to a first modification of the first preferred embodiment of the present invention.

A piezoelectric substrate 22 according to the first modification illustrated in FIG. 8 includes a high acoustic velocity support substrate 23, the low acoustic velocity film 5 disposed on the high acoustic velocity support substrate 23, and the piezoelectric layer 6 disposed on the low acoustic velocity film 5. According to the first modification, a high acoustic velocity layer according to a preferred embodiment of the present invention is the high acoustic velocity support substrate 23. The piezoelectric layer 6 is disposed above the high acoustic velocity support substrate 23 indirectly with the low acoustic velocity film 5 interposed therebetween.

The high acoustic velocity support substrate 23 is a silicon substrate. The high acoustic velocity support substrate 23 may not necessarily be made of the above-mentioned material. Other examples of suitable materials include aluminum oxide, silicon carbide, silicon nitride, silicon oxynitride, silicone, sapphire, lithium tantalate, lithium niobate, quartz, alumina, zirconia, cordierite, mullite, steatite, forsterite, magnesia, DLC, diamond, and a medium containing any of the above-mentioned materials as a main component.

As described above, the acoustic wave device according to the first modification includes the piezoelectric substrate 22, which is a multilayer body formed by stacking the high acoustic velocity support substrate 23, the low acoustic velocity film 5, and the piezoelectric layer 6 in this order. As with the first preferred embodiment, this configuration allows acoustic wave energy to be confined near the piezoelectric layer 6.

Figure 9:
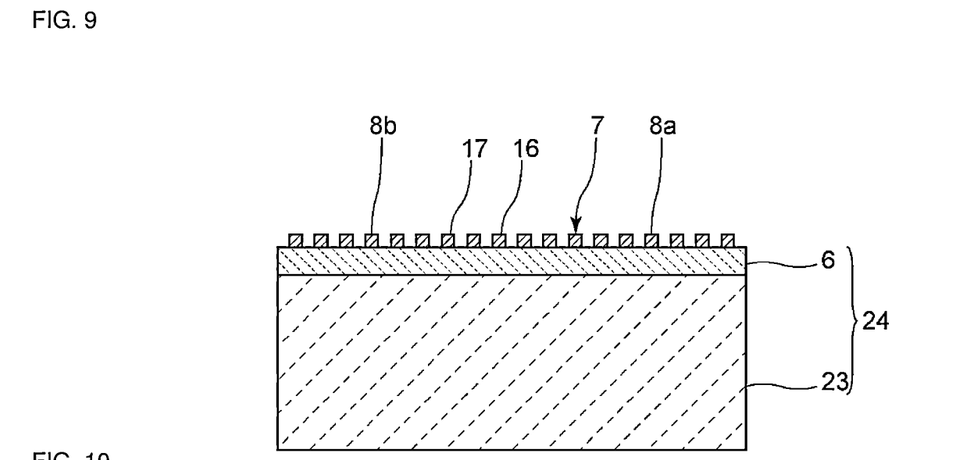
FIG. 9 is a front cross-sectional view of an acoustic wave device according to a second modification of the first preferred embodiment of the present invention.

A piezoelectric substrate 24 according to the second modification illustrated in FIG. 9 includes the high acoustic velocity support substrate 23, and the piezoelectric layer 6 disposed directly on the high acoustic velocity support substrate 23. As with the first preferred embodiment, the second modification also allows acoustic wave energy to be confined near the piezoelectric layer 6.

Figure 10:
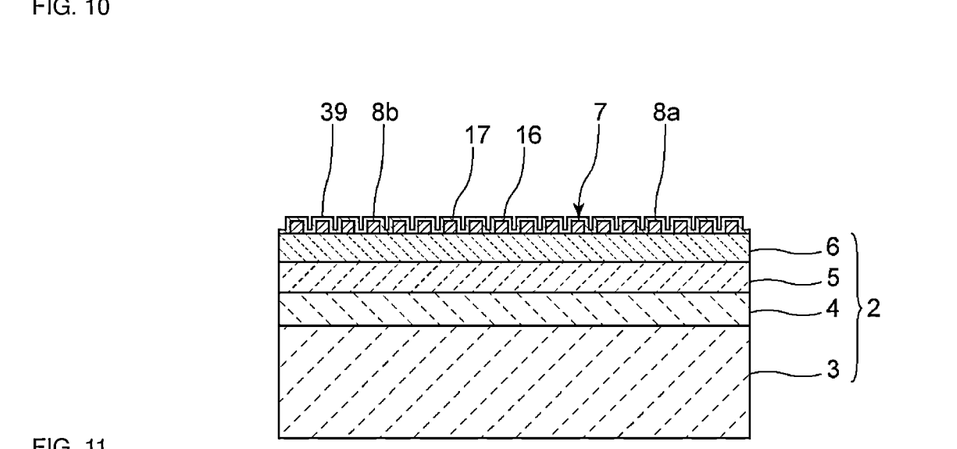
FIG. 10 is a front cross-sectional view of an acoustic wave device according to a second preferred embodiment of the present invention.
Figure 11:
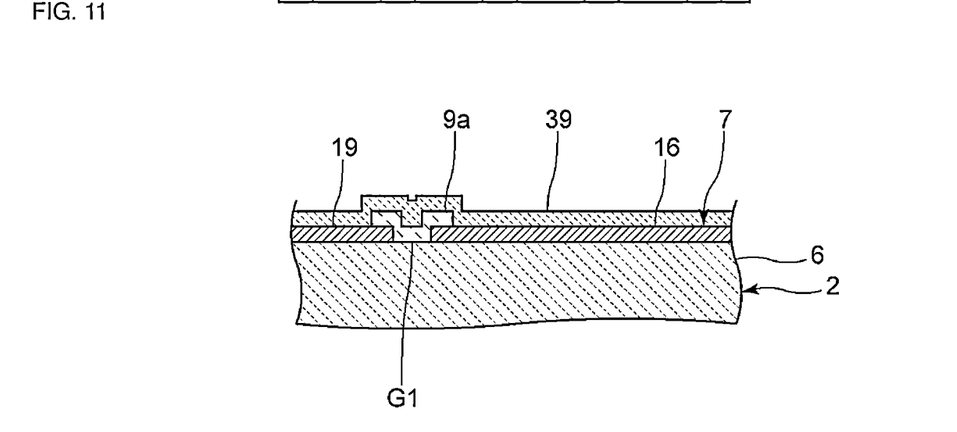
FIG. 11 is a cross-sectional view of the vicinity of a first gap of an IDT electrode according to the second preferred embodiment of the present invention.

FIG. 10 is a front cross-sectional view of an acoustic wave device according to a second preferred embodiment of the present invention. FIG. 11 is a cross-sectional view of the vicinity of the first gap of the IDT electrode according to the second preferred embodiment. FIG. 11 depicts a cross section taken along the line I-I in FIG. 2.

As illustrated in FIGS. 10 and 11, the second preferred embodiment differs from the first preferred embodiment in that a second dielectric film 39 is disposed over the piezoelectric substrate 2 so as to cover the IDT electrode 7, the first dielectric film 9a, and the first dielectric film 9b. The acoustic wave device according to the second preferred embodiment is otherwise similar in configuration to the acoustic wave device 1 according to the first preferred embodiment.

Although not particularly limited, the second dielectric film 39 according to the second preferred embodiment is a silicon oxide film. More specifically, the second dielectric film 39 is a $SiO_2$ film. The second dielectric film 39 can be used as, for example, a protective film. This helps to reduce damage to the IDT electrode 7.

According to the second preferred embodiment, as with the first preferred embodiment, the first dielectric film 9a is disposed in the first gap G1, and the first dielectric film 9b is disposed in the second gap G2. This helps to reduce ripple near the resonant frequency.

Figure 12:
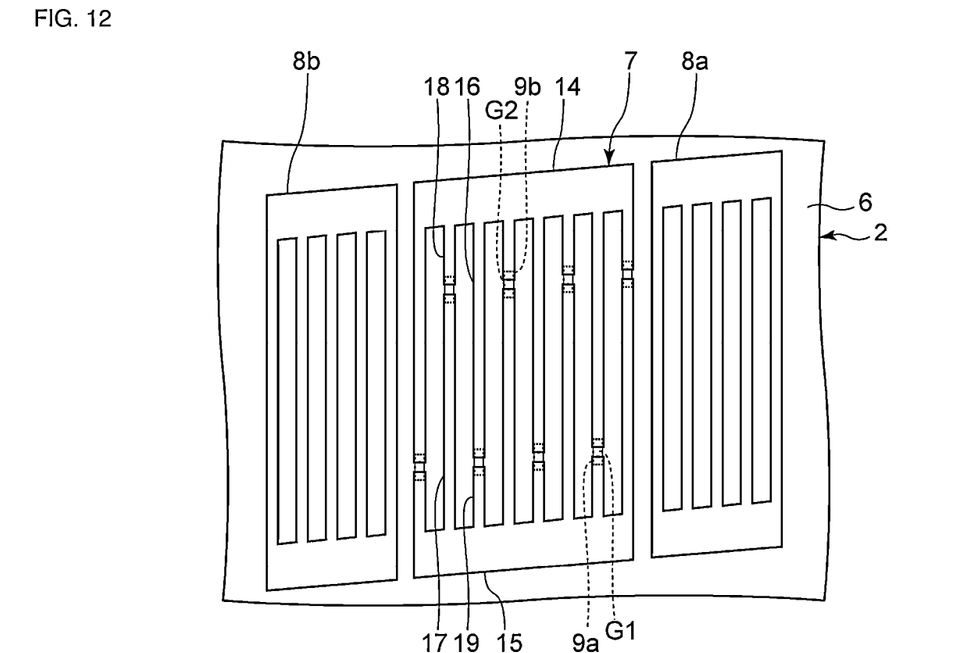
FIG. 12 is a plan view of an acoustic wave device according to a third preferred embodiment of the present invention.
Figure 13:
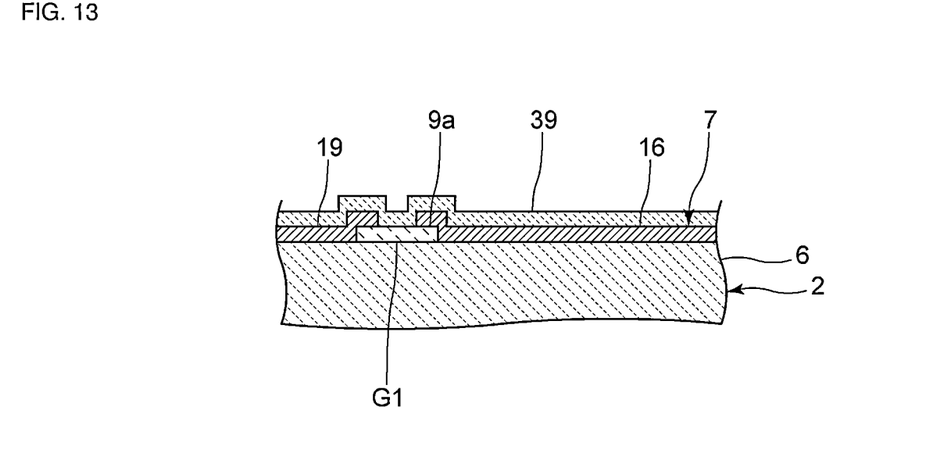
FIG. 13 is a cross-sectional view of the vicinity of a first gap of an IDT electrode according to the third preferred embodiment of the present invention.

FIG. 12 is a plan view of an acoustic wave device according to a third preferred embodiment. FIG. 13 is a cross-sectional view of the vicinity of the first gap of the IDT electrode according to the third preferred embodiment. The second dielectric film is not illustrated in FIG. 12. FIG. 13 depicts a cross section taken along the line I-I in FIG. 2.

As illustrated in FIGS. 12 and 13, the third preferred embodiment differs from the first preferred embodiment in that the first dielectric film 9a extends to an area between each of the first electrode finger 16 and the second dummy electrode finger 19, and the piezoelectric substrate 2. More specifically, the first dielectric film 9a extends to an area between the first electrode fingers 16 and the piezoelectric substrate 2, and extends to an area between the second dummy electrode finger 19 and the piezoelectric substrate 2. Further, the third preferred embodiment differs from the first preferred embodiment also in that the first dielectric film 9b extends to an area between each of the second electrode finger 17 and the first dummy electrode finger 18, and the piezoelectric substrate 2. The acoustic wave device according to the third preferred embodiment is otherwise similar in configuration to the acoustic wave device according to the second preferred embodiment.

As illustrated in FIG. 13, according to the third preferred embodiment as well, the second dielectric film 39 is disposed over the piezoelectric substrate 2 so as to cover the IDT electrode 7, the first dielectric film 9a, and the first dielectric film 9b.

An acoustic wave device configured according to the third preferred embodiment, and an acoustic wave device according to a second comparative example are fabricated. The acoustic wave device according to the second comparative example is similar in configuration to the acoustic wave device according to the third preferred embodiment, except that the first dielectric film 9a and the first dielectric film 9b are not provided.

The acoustic wave device configured according to the third preferred embodiment, and the acoustic wave device according to the second comparative example are fabricated under the conditions described below.

Piezoelectric layer: 50° YX-LiTaO$_3$ (material), 600 nm (film thickness)
Low acoustic velocity film: silicon oxide (SiO$_2$) (material), 673 nm (film thickness)
Low acoustic velocity film: silicon nitride (SiN) (material), 900 nm (film thickness)
Support substrate: silicon (Si) (material), Si(100) (crystal orientation), (0°, 0°,45°) (Euler angles)
Respective film thicknesses of the metal layers of the IDT electrode: 12 nm (film thickness of the Ti layer near the piezoelectric layer), 100 nm (film thickness of the Al layer), 4 nm (film thickness of the Ti layer)
Wavelength: 2 μm
Overlap width: 30 μm
Number of electrode finger pairs of the IDT electrode:
Slant angle: 7.5°
First gap width and second gap width: 0.27 μm
Second dielectric film: SiO$_2$ (material), 35 nm (film thickness)

The first dielectric film of the acoustic wave device configured according to the third preferred embodiment is fabricated under the condition described below.

First dielectric film: tantalum pentoxide (Ta$_2$O$_5$) (material), 30 nm (film thickness)

Figure 14:
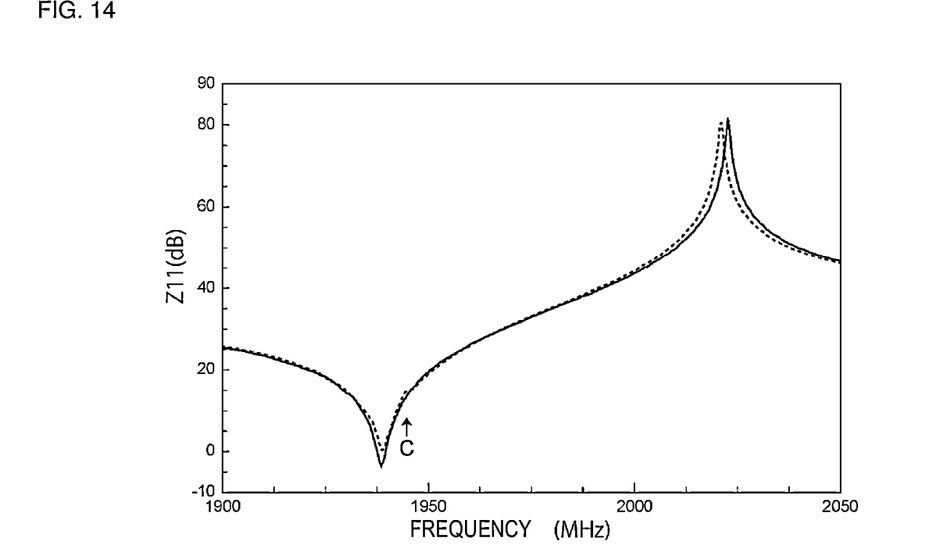
FIG. 14 illustrates impedance characteristics according to the third preferred embodiment of the present invention and according to a second comparative example.
Figure 15:
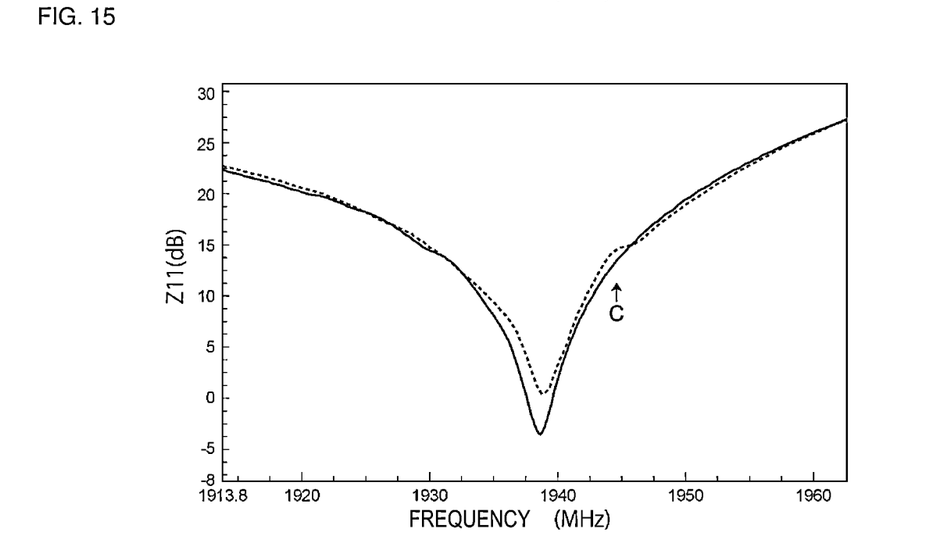
FIG. 15 illustrates impedance characteristics near the resonant frequency, according to the third preferred embodiment of the present invention and according to the second comparative example.

The respective impedance characteristics of the above-mentioned acoustic wave devices are illustrated in FIG. 14 and FIG. 15 described below.

FIG. 14 illustrates impedance characteristics according to the third preferred embodiment and according to the second comparative example. FIG. 15 illustrates impedance characteristics near the resonant frequency, according to the third preferred embodiment and according to the second comparative example. In FIGS. 14 and 15, the solid line represents according to the third preferred embodiment, and the broken line represents the results according to the second comparative example.

As indicated by an arrow C in FIGS. 14 and 15, it is appreciated that for the second comparative example, ripple occurs near the resonant frequency. By contrast, it is appreciated that for the third preferred embodiment, ripple does not occur near the resonant frequency. As described above, the third preferred embodiment allows for reduced ripple near the resonant frequency. Further, the third preferred embodiment ensures with increased reliability that, even if the first dielectric film 9a is displaced during manufacture of the acoustic wave device according to the third preferred embodiment, the first dielectric film 9a can be positioned to extend across the entire first gap G1. Likewise, the third preferred embodiment ensures with increased reliability that the first dielectric film 9b can be positioned to extend across the entire second gap G2. This allows for more reliable and effective reduction of ripple near the resonant frequency.

Moreover, as illustrated in FIG. 14, the resonant frequency is roughly the same for the third preferred embodiment and the second comparative example. By contrast, it is appreciated that the anti-resonant frequency according to the third preferred embodiment is located higher than the anti-resonant frequency according to the second comparative example. According to the third preferred embodiment, the first dielectric film 9a illustrated in FIG. 12 extends to an area between each of the first electrode finger 16 and the second dummy electrode finger 19, and the piezoelectric substrate 2. Further, the first dielectric film 9b extends to an area between each of the second electrode finger 17 and the first dummy electrode finger 18, and the piezoelectric substrate 2. The above configuration allows for increased fractional band width.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric substrate; and
an interdigital transducer (IDT) electrode on the piezoelectric substrate; wherein
the piezoelectric substrate includes a high acoustic velocity layer, and a piezoelectric layer directly or indirectly above the high acoustic velocity layer;
an acoustic velocity of a bulk wave that propagates in the high acoustic velocity layer is greater than an acoustic velocity of an acoustic wave that propagates in the piezoelectric layer;
the IDT electrode includes:
a first busbar and a second busbar that face each other;
a plurality of first electrode fingers each connected at one end to the first busbar; and
a plurality of second electrode fingers each connected at one end to the second busbar, the plurality of second electrode fingers being interdigitated with the plurality of first electrode fingers;
a first envelope extends in a slanted direction with respect to a direction of acoustic wave propagation, the first envelope being an imaginary line formed by connecting tips of the plurality of first electrode fingers;
a second envelope extends in a slanted direction with respect to the direction of acoustic wave propagation, the second envelope being an imaginary line formed by connecting tips of the plurality of second electrode fingers;
a first dielectric film is located in at least one gap on the piezoelectric substrate, the at least one gap being at least one of a plurality of first gaps and a plurality of second gaps, the plurality of first gaps being located between the plurality of first electrode fingers and the second busbar, the plurality of second gaps being located between the plurality of second electrode fingers and the first busbar;
the first dielectric film has a density greater than a density of silicon oxide; and
a second dielectric film extends over the piezoelectric substrate such that the second dielectric film covers the IDT electrode and the first dielectric film.

2. The acoustic wave device according to claim 1, wherein the first dielectric film has a density greater than or equal to a density of the IDT electrode.

3. The acoustic wave device according to claim 1, wherein the IDT electrode includes a plurality of first dummy electrode fingers each connected at one end to the first busbar, and a plurality of second dummy electrode fingers each connected at one end to the second busbar; and each of the plurality of first gaps is located between a corresponding one of the plurality of first electrode fingers and a corresponding one of the plurality of second dummy electrode fingers; and each of the plurality of second gaps is located between a corresponding one of the plurality of second electrode fingers and a corresponding one of the plurality of first dummy electrode fingers.

4. The acoustic wave device according to claim 1, wherein the first dielectric film extends across an entirety of the first gap in which the first dielectric film is located, or extends across an entirety of the second gap in which the first dielectric film is located.

5. The acoustic wave device according to claim 3, wherein the first dielectric film in the first gap extends across an entirety of the first gap, and extends onto the first electrode finger and onto the second dummy electrode finger; and the first dielectric film in the second gap extends across an entirety of the second gap, and extends onto the second electrode finger and onto the first dummy electrode finger.

6. The acoustic wave device according to claim 3, wherein the first dielectric film in the first gap extends across an entirety of the first gap, and extends to an area between the first electrode finger and the piezoelectric substrate and to an area between the second dummy electrode finger and the piezoelectric substrate; and the first dielectric film in the second gap extends across an entirety of the second gap, and extends to an area between the second electrode finger and the piezoelectric substrate and to an area between the first dummy electrode finger and the piezoelectric substrate.

7. The acoustic wave device according to claim 1, wherein the piezoelectric substrate includes a low acoustic velocity film between the high acoustic velocity layer and the piezoelectric layer; and an acoustic velocity of a bulk wave that propagates in the low acoustic velocity film is less than an acoustic velocity of a bulk wave that propagates in the piezoelectric layer.

8. The acoustic wave device according to claim 1, wherein the high acoustic velocity layer is a high acoustic velocity support substrate.

9. The acoustic wave device according to claim 1, wherein the piezoelectric substrate further includes a support substrate; and the high acoustic velocity layer is a high acoustic velocity film on the support substrate.

10. The acoustic wave device according to claim 1, further comprising reflectors on opposite sides of the IDT electrode.

11. The acoustic wave device according to claim 7, wherein the low acoustic velocity film includes at least one of silicon oxide, glass, silicon oxynitride, tantalum oxide or a material including as a main component a compound with fluorine, carbon or boron along with silicon oxide.

12. The acoustic wave device according to claim 1, wherein the high acoustic velocity layer includes at least one of silicon nitride, lithium tantalate, lithium niobate, quartz, alumina, zirconia, cordierite, mullite, steatite, forsterite, aluminum nitride, aluminum oxide, silicon carbide, silicon oxynitride, a diamond-like carbon, silicone, sapphire, diamond, or magnesia.

13. The acoustic wave device according to claim 9, wherein the support substrate includes at least one of silicon, lithium tantalate, lithium niobate, quartz, alumina, magnesia, silicon nitride, aluminum nitride, silicon carbide, zirconia, cordierite, mullite, steatite, forsterite, glass, spinel, aluminum nitride, aluminum oxide, silicon carbide, silicon nitride, silicon oxynitride, diamond-like carbon, silicone, sapphire, diamond, or magnesia.

14. The acoustic wave device according to claim 8, wherein the high velocity support substrate includes silicon, aluminum oxide, silicon carbide, silicon nitride, silicon oxynitride, silicone, sapphire, lithium tantalate, lithium niobate, quartz, alumina, zirconia, cordierite, mullite, steatite, forsterite, magnesia, diamond-like carbon, or diamond.

15. The acoustic wave device according to claim 1, wherein the second dielectric film includes silicon oxide.

16. The acoustic wave device according to claim 1, wherein the second dielectric film is a protective film.

* * * * *